(12) United States Patent
Onuma et al.

(10) Patent No.: US 7,719,085 B2
(45) Date of Patent: May 18, 2010

(54) SEMICONDUCTOR DEVICE AND METHOD OF MANUFACTURING THE SAME

(75) Inventors: Takuji Onuma, Kanagawa (JP); Yasutaka Nakashiba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 256 days.

(21) Appl. No.: 11/483,533

(22) Filed: Jul. 11, 2006

(65) Prior Publication Data

US 2007/0013028 A1  Jan. 18, 2007

(30) Foreign Application Priority Data

Jul. 14, 2005  (JP) .............................. 2005-205303

(51) Int. Cl.
H01L 27/04 (2006.01)
H01L 29/00 (2006.01)
H01L 21/822 (2006.01)

(52) U.S. Cl. .............................. 257/532; 257/E23.057; 257/E21.008; 257/E21.579; 257/680; 257/924; 257/774; 438/957; 438/634; 438/637; 438/638

(58) Field of Classification Search ................. 257/532, 257/924, E23.057, E21.008, E21.579, 680, 257/774, E21.011, E21.582; 438/957, 634, 438/637, 638
See application file for complete search history.

(56) References Cited

U.S. PATENT DOCUMENTS

| | | | | |
|---|---|---|---|---|
| 6,171,941 B1 * | 1/2001 | Park et al. | .................... | 438/586 |
| 6,940,114 B2 * | 9/2005 | Oh et al. | .................... | 257/296 |
| 2003/0211731 A1 * | 11/2003 | Kai et al. | .................... | 438/638 |
| 2005/0067701 A1 * | 3/2005 | Coolbaugh et al. | .......... | 257/751 |
| 2005/0170553 A1 * | 8/2005 | Merkulov et al. | ........... | 438/100 |
| 2006/0183280 A1 * | 8/2006 | Lee et al. | .................... | 438/239 |
| 2006/0222760 A1 * | 10/2006 | Helneder et al. | ........... | 427/96.1 |
| 2007/0077700 A1 * | 4/2007 | Lin et al. | .................... | 438/239 |

(Continued)

FOREIGN PATENT DOCUMENTS

JP  2003-324153  11/2003

OTHER PUBLICATIONS

Peter Zurcher et al., Integration of Thin Film MIM Capacitors and Resistors Into Copper Metallization Based RF-CMOS and BI CMOS Technologies, 0-7803-6438-4/00.
M. Armacost et al., A High Reliability Metal Insulator Metal Capacitor for 0.18 μm Copper Technology, 0-7803-6438-4.

(Continued)

*Primary Examiner*—Alexander O Williams
(74) *Attorney, Agent, or Firm*—Young & Thompson (57) ABSTRACT

A semiconductor device 1 includes an interconnect 12, a conductive layer 14 (first conductive layer), an insulating layer 20 (first insulating layer), another conductive layer 30 (second conductive layer), another insulating layer 40 (second insulating layer), a via plug 52 (first via plug), and another via plug 54 (second via plug). In the semiconductor device 1, the conductive layer 14, the insulating layer 20 and the conductive layer 30 constitute a MIM capacitor (capacitor element). To be more detailed, the conductive layer 14, the insulating layer 20 and the conductive layer 30 serve as a lower electrode, an insulating capacitor film and an upper electrode, respectively. The insulating layer 40 covers both the conductive layer 30 and the interconnect 12. The insulating layer 40 works as the etching stopper for the via plugs 52, 54.

7 Claims, 11 Drawing Sheets

U.S. PATENT DOCUMENTS

2007/0080426 A1*  4/2007  Matz et al. .................. 257/516
2007/0176259 A1*  8/2007  Yoshinaga .................. 257/532
2007/0298580 A1* 12/2007  Lee et al. .................... 438/393
2008/0130200 A1*  6/2008  Edelstein et al. ............ 361/330

OTHER PUBLICATIONS

C.H. Ng et al., Characterization and Comparison of Two Metal-Insulator-Metal Capacitor Schmes in 0.13 μm Copper Dual Damascene Metallization Process for Mixed-Mode and RF Applications.

* cited by examiner

SEMICONDUCTOR DEVICE AND METHOD OF MANUFACTURING THE SAME

This application is based on Japanese patent application No. 2005-205303, the content of which is incorporated hereinto by reference.

BACKGROUND

1. Technical Field

The present invention relates to a semiconductor device and a method of manufacturing the same.

2. Related Art

Semiconductor devices so far developed include those disclosed in Patent Document 1 and Non-patent Documents 1 to 3 cited below. All the semiconductor devices described therein include a MIM (Metal Insulator Metal) capacitor as a capacitor element. In those semiconductor devices, an etching stopper layer serves as an insulating capacitor film.

(Patent Document 1) Japanese Laid-open patent publication No. 2003-324153

(Non-patent Document 1) Peter Zurcher et al., "Integration of Thin Film MIM Capacitors and Resistors into Copper Metallization based RF-CMOS and Bi-CMOS Technologies", Electron Device Meeting 2000, IEDM Technical Digest, International 10-13, December 2000, p. 153-156

(Non-patent Document 2) M. Armacost et al., "A High Reliability Metal Insulator Metal Capacitor for 0.18 μm Copper Technology", Electron Device Meeting 2000, IEDM Technical Digest, International 10-13, December 2000, p. 157-160

(Non-patent Document 3) C. H. Ng et al., "Characterization and comparison of Two Metal-Insulator-Metal Capacitor Schemes in 0.13 μm Copper Dual Damascene Metallization Process for Mixed-Mode and RF Applications", Electron Device Meeting 2002, IEDM '02 Digest, International 8-11, December 2002, p. 241-244

Figure 11:
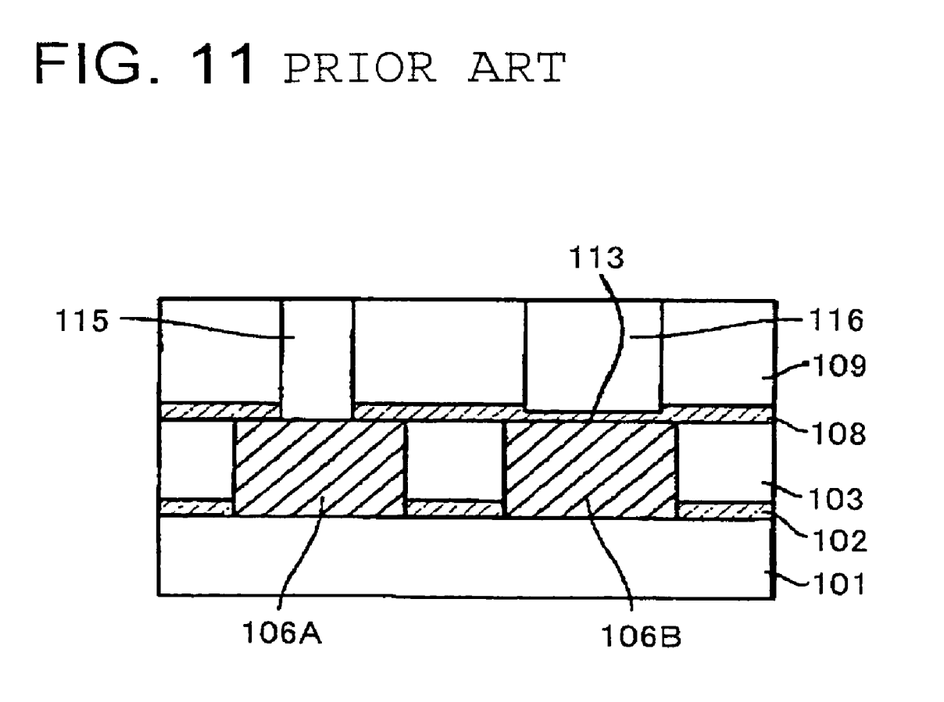
FIG. 11 is a schematic cross-sectional view showing a semiconductor device according to the Patent Document 1.

FIG. 11 is a schematic cross-sectional view showing the semiconductor device according to the Patent Document 1. The semiconductor device includes an insulating interlayer 103 formed on a semiconductor substrate 101 via an etching stopper layer 102. The insulating interlayer 103 includes copper interconnects 106A, 106B buried therein, and the copper interconnect 106B serves as a lower electrode for a capacitor element. Accordingly, the insulating interlayer 103 commonly includes a conductive layer (copper interconnect 106A) ordinarily working as an interconnect, and another conductive layer (copper interconnect 106B) serving as both the interconnect and the lower electrode.

On the insulating interlayer 103, an insulating interlayer 109 is provided via an etching stopper layer 108. The insulating interlayer 109 includes a via 115 connected to the copper interconnect 106A and an upper electrode 116, buried therein. Accordingly, the etching stopper layer 108 works not only as the etching stopper when the via 115 is formed, but also as an insulating capacitor film 113. The portion of the etching stopper layer 108 working as the insulating capacitor film 113, i.e. the portion interposed between the lower electrode and the upper electrode, is made thinner than the remaining portions, because of the etching process that reduces the thickness.

The semiconductor device according to the Non-patent Documents 2 and 3 includes a second etching stopper layer on an upper electrode, in addition to a first etching stopper layer that serves as an insulating capacitor film. Such second etching stopper layer is intended for use as the etching stopper when a via plug to be connected to the upper electrode is formed.

SUMMARY OF THE INVENTION

Meanwhile, for increasing the capacitance value of the capacitor element, it is necessary to reduce the thickness of the insulating capacitor film as much as possible. However, when the insulating capacitor film serves also as the etching stopper as in the foregoing conventional semiconductor device, the insulating capacitor film has to have a certain level of thickness, in order to perform as expected both as the etching stopper and as a diffusion barrier against a metal (copper, when the interconnect is made of copper). Because of such contradictory requirements, it is difficult, in the conventional semiconductor device, to attain a high capacitance value.

In this aspect, in the semiconductor device shown in FIG. 11, as already stated, the portion of the etching stopper layer 108 working as the insulating capacitor film 113 is selectively subjected to the etching process, for reducing the thickness thereof. Such arrangement allows achieving a high capacitance value, without compromise in performance as the etching stopper and as the diffusion barrier by the etching stopper layer 108.

When performing the etching process for reducing the thickness, however, it is difficult to precisely control the thickness of the insulating capacitor film. Fluctuation in thickness of the insulating capacitor film naturally leads to fluctuation in capacitance value of the capacitor element.

According to the present invention, there is provided a semiconductor device comprising an interconnect provided in a first insulating interlayer; a first conductive layer located with a spacing from the interconnect; a first insulating layer provided on the first conductive layer; a second conductive layer provided so as to face the first conductive layer across the first insulating layer, and constituting a capacitor element in combination with the first conductive layer and the first insulating layer; a second insulating layer covering both the second conductive layer and the interconnect; a first via plug provided in a second insulating interlayer, and penetrating the second insulating layer thus to be connected to the interconnect; and a second via plug provided in the second insulating interlayer, and penetrating the second insulating layer thus to be connected to the second conductive layer.

In the semiconductor device thus constructed, the first conductive layer, the first insulating layer and the second conductive layer constitute the capacitor element. To be more detailed, the first and the second conductive layer serve as the electrodes for the capacitor element, and the first insulating layer serves as the insulating capacitor film. Here, the second insulating layer is provided, in addition to the first insulating layer, so as to cover both the second conductive layer and the interconnect. The second insulating layer can work not only as the etching stopper for the first and the second via plug, but also as the diffusion barrier. Accordingly, in this semiconductor device the first insulating layer, which serves as the insulating capacitor film, is exempted from performing the functions of the etching stopper and the diffusion barrier, and hence does not have to have such thickness as required for performing those functions. Therefore, the semiconductor device facilitates achieving a high capacitance value.

Further, such structure allows determining the thickness of the first insulating layer when forming the same, unlike the semiconductor device of FIG. 11 in which the insulating capacitor film is subjected to the etching process for reducing the thickness, after having been once formed. The structure, accordingly, allows precisely controlling the thickness of the first insulating layer, when manufacturing this semiconductor device. Consequently, the semiconductor device facilitates restraining the fluctuation in capacitance value.

According to the present invention, there is also provided a method of manufacturing a semiconductor device, comprising forming an interconnect; forming a first conductive layer so that the first conductive layer have a spacing from the interconnect; forming a first insulating layer on the first conductive layer after the forming of the interconnect; forming a second conductive layer on the first insulating layer so that the second conductive layer face the first conductive layer across the first insulating layer and constitute a capacitor element in combination with the first conductive layer and the first insulating layer; forming a second insulating layer so that the second insulating layer cover both the second conductive layer and the interconnect; forming a first via plug so that the first via plug be connected to the interconnect, employing the second insulating layer as an etching stopper; and forming a second via plug so that the second via plug be connected to the second conductive layer, employing the second insulating layer as an etching stopper.

According to the method thus arranged, the second insulating layer is provided in addition to the first insulating layer, so as to cover both the second conductive layer and the interconnect. Such second insulating layer can be put to use as the etching stopper when the first and the second via plug are formed, and also as a diffusion barrier upon completing the manufacturing of the semiconductor device. Accordingly, the first insulating layer, which serves as the insulating capacitor film, is exempted from performing the functions of the etching stopper and the diffusion barrier, and hence does not have to have such thickness as required for performing those functions. The foregoing method allows, therefore, forming the first insulating layer in a sufficiently reduced thickness free from the requirement of granting a certain level of thickness.

The foregoing method of manufacturing further allows determining the thickness of the first insulating layer when forming the same, unlike the semiconductor device of FIG. 11 in which the insulating capacitor film is subjected to the etching process for reducing the thickness, after having been once formed. Such process, accordingly, allows precisely controlling the thickness of the first insulating layer, resulting in minimized fluctuation in capacitance value.

Thus, the present invention provides a semiconductor device that facilitates achieving a high and stable capacitance value, and a method of manufacturing such semiconductor device.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, exemplary embodiments of a semiconductor device and a method of manufacturing the same according to the present invention will be described in details, referring to the accompanying drawings. In the drawings, same constituents are given the identical numerals, and duplicating description may be omitted where appropriate.

First Embodiment

Figure 1:
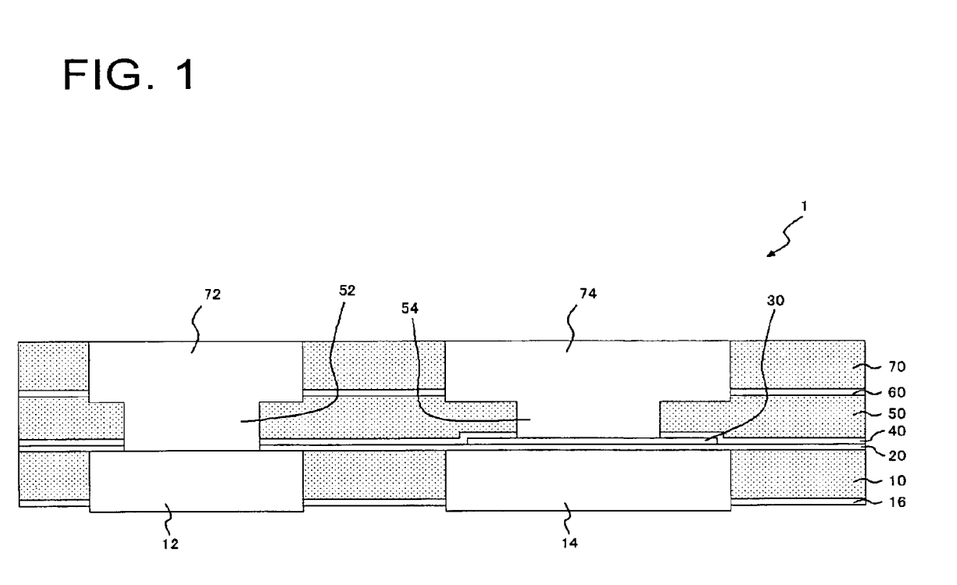
FIG. 1 is a schematic cross-sectional view showing a semiconductor device according to the first embodiment of the present invention.

FIG. 1 is a schematic cross-sectional view showing a semiconductor device according to the first embodiment of the present invention. The semiconductor device 1 includes an interconnect 12, a conductive layer 14 (first conductive layer), an insulating layer 20 (first insulating layer), another conductive layer 30 (second conductive layer), another insulating layer 40 (second insulating layer), a via plug 52 (first via plug), and another via plug 54 (second via plug).

In the semiconductor device 1, the conductive layer 14, the insulating layer 20 and the conductive layer 30 constitute a MIM capacitor (capacitor element). To be more detailed, the conductive layer 14, the insulating layer 20 and the conductive layer 30 serve as a lower electrode, an insulating capacitor film and an upper electrode, respectively.

The interconnect 12 and the conductive layer 14 are buried in the same insulating interlayer 10 (first insulating interlayer). The interconnect 12 and the conductive layer 14 are copper interconnects formed by Damascene process. Between the insulating interlayer 10 and an underlying layer (opposite to the insulating layer 20, not shown), an insulating layer 16 is provided. The insulating layer 16 works as an etching stopper for the interconnect 12 and the conductive layer 14. Here, the underlying layer may be an insulating interlayer that includes a contact plug or a via plug. In the semiconductor device 1, accordingly, the insulating interlayer 10 may be the insulating interlayer constituting the lowermost interconnect layer, or the insulating interlayer constituting the second lowest or upper interconnect layer.

The conductive layer 14 constitutes a part of the capacitor element, while serving as an interconnect. The conductive layer 14 is spaced from the interconnect 12.

On the conductive layer 14 (insulating interlayer 10), the insulating layer 20 is provided. The insulating layer 20 covers both of the interconnect 12 and the conductive layer 14. Suitable materials of the insulating layer 20 include $SiO_2$, SiN, SiCN, SiON, $TaO_2$ and $ZrO_2$.

On the insulating layer 20, the conductive layer 30 is provided. The conductive layer 30 is disposed so as to face the conductive layer 14 across the insulating layer 20. Suitable materials of the conductive layer 30 include TiN, Ti, Ta, TiW, Al and W. In this embodiment, the conductive layer 30 is smaller in area than the conductive layer 14, and located within the outline thereof, in a plan view.

On the insulating layer 20, the insulating layer 40 is also provided. The insulating layer 40 covers both of the conductive layer 30 and the interconnect 12. In this embodiment, the insulating layer 40 covers the interconnect 12 via the insulating layer 20. Suitable materials of the insulating layer 40 include SiN, SiCN and SiON. It is to be noted here that the material of the insulating layer 40 has to be distinctive from the insulating interlayer 50 described later in etching selectivity.

On the insulating layer 40, the insulating interlayer 50 (second insulating interlayer) is provided. The insulating interlayer 50 includes via plugs 52, 54 buried therein. The via plug 52 is formed so as to penetrate the insulating layer 40 and the insulating layer 20, thus to be connected to the interconnect 12. The via plug 54 is formed so as to penetrate the insulating layer 40, thus to be connected to the conductive layer 30. Accordingly, the insulating layer 40 works as the etching stopper for the via plug 52, 54.

On the insulating interlayer 50, an insulating interlayer 70 is provided via an insulating layer 60. The insulating interlayer 70 includes interconnects 72, 74, buried therein and connected to the via plugs 52, 54 respectively. The insulating layer 60 works as the etching stopper for the interconnects 72, 74. Here, the via plugs 52, 54 and the interconnects 72, 74 are made of copper, and formed by Damascene process.

Figure 2A:
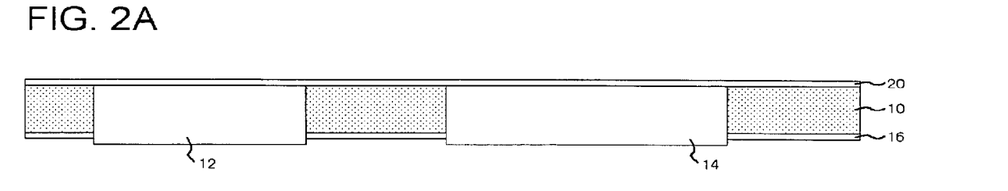
FIGS. 2A to 2C are schematic cross-sectional views progressively showing a method of manufacturing the semiconductor device shown in FIG. 1.

Referring now to FIGS. 2A to 3B, a method of manufacturing such semiconductor device 1 will be described, as an embodiment of a method of manufacturing a semiconductor device according to the present invention. First, after forming the insulating layer 16 and the insulating interlayer 10 in this sequence, the interconnect 12 and the conductive layer 14 are formed with a spacing therebetween. In this embodiment, the interconnect 12 and the conductive layer 14 are formed simultaneously by Damascene process. Then the insulating layer 20 is deposited on the conductive layer 14 (insulating interlayer 10), by CVD process for example (FIG. 2A).

Figure 2B:
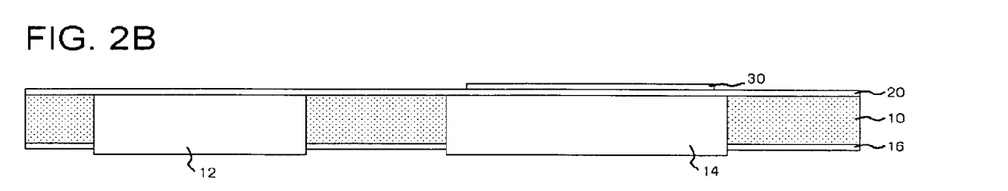
Figure 2C:
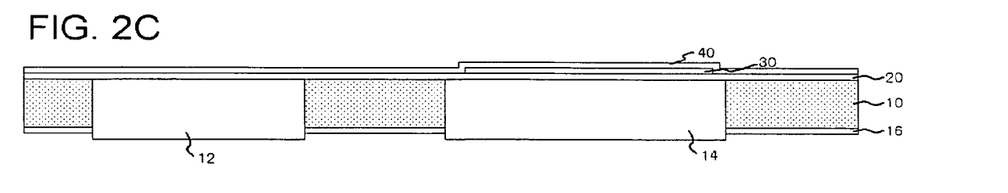

Next, on the insulating layer 20, a conductive layer, which is to serve as the conductive layer 30, is formed by sputtering or CVD process for example. A predetermined portion of the conductive layer is then covered with a resist and subjected to an etching process, so as to form the conductive layer 30 at a position facing the conductive layer 14 across the insulating layer 20 (FIG. 2B). Further, the insulating layer 40 is deposited, by CVD process for example, all over the insulating layer 20 including the region where the conductive layer 30 has been formed. At this stage, the insulating layer 40 that covers both the conductive layer 30 and the interconnect 12 is obtained (FIG. 2C).

Figure 3A:
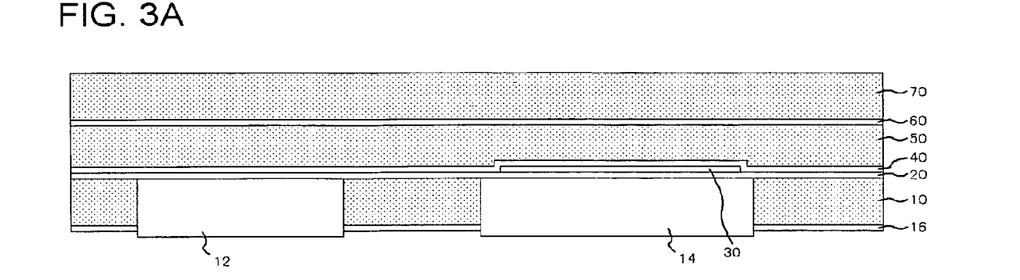
FIGS. 3A and 3B are schematic cross-sectional views progressively showing a method of manufacturing the semiconductor device shown in FIG. 1.
Figure 3B:
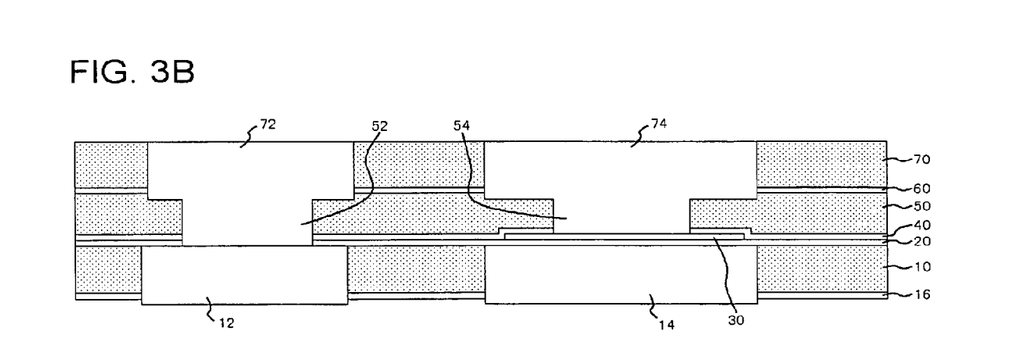

Next, on the insulating layer 40 thus formed, the insulating interlayer 50, the insulating layer 60 and the insulating interlayer 70 are sequentially formed (FIG. 3A). The via plugs 52, 54 and the interconnects 72, 74 are then formed by Damascene process. In this process, the insulating layer 40 works as the etching stopper for the via plugs 52, 54, and the insulating layer 60 works as the etching stopper for the interconnects 72, 74 (FIG. 3B).

The foregoing embodiment offers the following advantageous effects. In this embodiment, the insulating layer 40 is provided in addition to the insulating layer 20, so as to cover both the conductive layer 30 and the interconnect 12. Such insulating layer 40 can be put to use as the etching stopper for the via plugs 52, 54, and also as a diffusion barrier. In the semiconductor device 1, accordingly, the insulating layer 20, which serves as the insulating capacitor film, is exempted from performing the functions of the etching stopper and the diffusion barrier, and hence does not have to have such thickness as required for performing those functions. Therefore, the method of this embodiment allows forming the insulating layer 20 in a sufficiently reduced thickness free from the requirement of granting a certain level of thickness, when forming the insulating layer 20.

Further, the foregoing method allows determining the thickness of the insulating layer 20 when forming the same, unlike the semiconductor device of FIG. 11 in which the insulating capacitor film is subjected to the etching process for reducing the thickness, after having been once formed. Such process, accordingly, allows precisely controlling the thickness of the insulating layer 20 during the formation process thereof. This leads to minimized fluctuation in capacitance value. Consequently, this embodiment provides the semiconductor device 1 that facilitates achieving a high and stable capacitance value, and the method of manufacturing such semiconductor device.

The conductive layer 14 is included in the same insulating interlayer that includes the interconnect 12, and serves both as the lower electrode of the capacitor element and as an interconnect. Utilizing thus a portion of the interconnect in the insulating interlayer as the lower electrode allows simplifying the manufacturing process of the semiconductor device 1. Actually, in the foregoing manufacturing method, the formation of the interconnect 12 and that of the conductive layer 14 are performed simultaneously. Such arrangement simplifies the process, compared to separately performing each process.

Also, utilizing a portion of the interconnect in the insulating interlayer as the lower electrode (conductive layer 14) eliminates the need to form a via plug to be connected to the conductive layer 14. This further simplifies the manufacturing process of the semiconductor device 1. Further, now that the via plug connected to the lower electrode is not needed, it suffices to design two types of depths of via plugs (via plugs 52, 54). This facilitates the formation of the via plugs, and hence the manufacturing of the semiconductor device 1.

The conductive layer 30 is smaller in area than the conductive layer 14 and located within the outline thereof, in a plan view. Accordingly, the peripheral portion of the conductive layer 14 is not facing the conductive layer 30, and hence such peripheral portion does not substantially serve as the lower electrode. Therefore, even though the conductive layer 14 has an uneven surface, the unevenness does not produce any adverse effect. Especially when the conductive layer 14 is formed by Damascene process, the uneven surface is prone to be formed along the periphery thereof. Utilizing such uneven portion as the lower electrode would lead to degradation in reliability of the capacitor element, and hence the semiconductor device 1.

Second Embodiment

Figure 4:
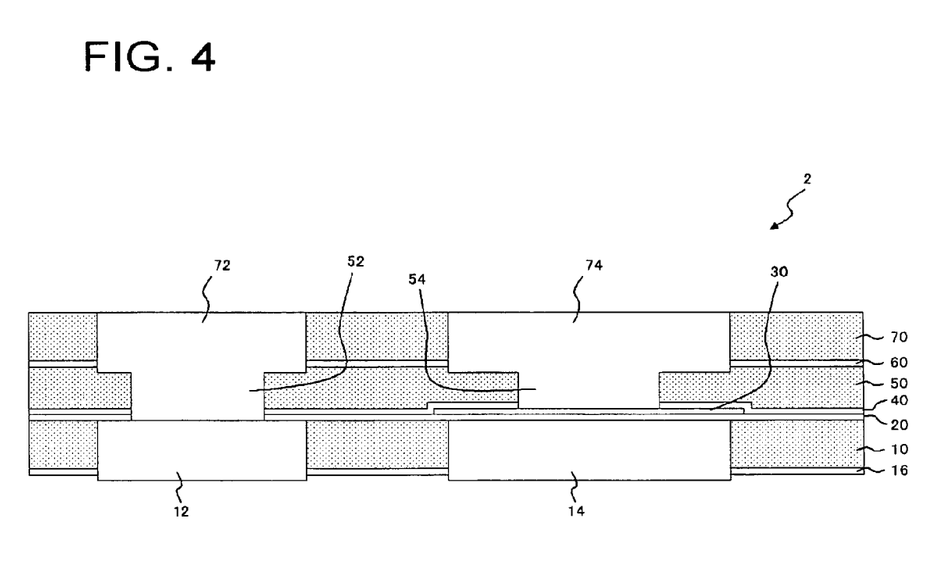
FIG. 4 is a schematic cross-sectional view showing a semiconductor device according to the second embodiment of the present invention.

FIG. 4 is a schematic cross-sectional view showing a semiconductor device according to the second embodiment of the present invention. The semiconductor device 2 includes the interconnect 12, the conductive layer 14, the insulating layer 20, the conductive layer 30, the insulating layer 40, the via plug 52 and the via plug 54. Except the conductive layer 30, the constituents are the same as those of the semiconductor device 1.

In the semiconductor device 2, the conductive layer 30 is larger in area than the conductive layer 14, and encloses therewithin the conductive layer 14 in a plan view. This is the difference between the conductive layer 30 of the semiconductor device 2 and the conductive layer 30 of the semiconductor device 1.

This embodiment also provides the semiconductor device 2 that facilitates achieving a high and stable capacitance value, and the method of manufacturing such semiconductor device, for the same reasons as with the foregoing embodiment. Moreover, since the entirety of the conductive layer 14 can serve as the lower electrode, a still higher capacitance value can be achieved.

Third Embodiment

Figure 5:
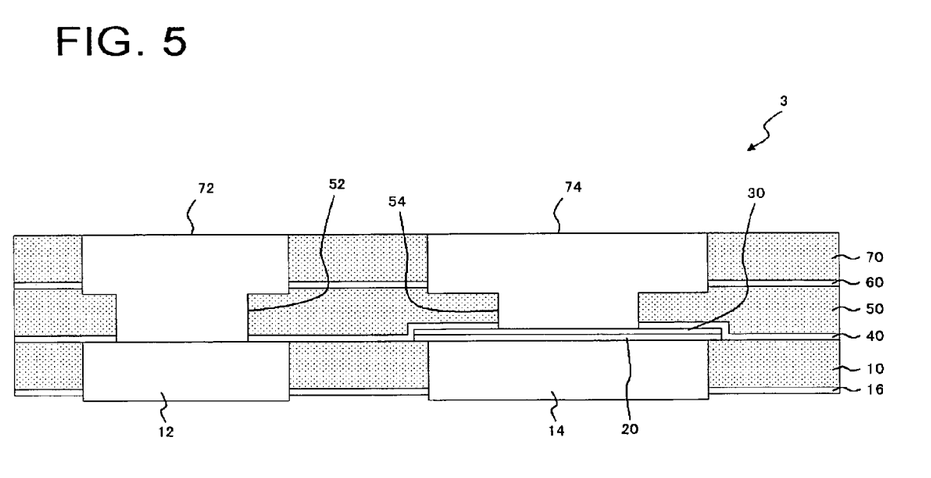
FIG. 5 is a schematic cross-sectional view showing a semiconductor device according to the third embodiment of the present invention.

FIG. 5 is a schematic cross-sectional view showing a semiconductor device according to the third embodiment of the present invention. The semiconductor device 3 includes the interconnect 12, the conductive layer 14, the insulating layer 20, the conductive layer 30, the insulating layer 40, the via plug 52 and the via plug 54. Except the insulating layer 20, the constituents are the same as those in the semiconductor device 2.

In the semiconductor device 3, the insulating layer 20 is only provided on the conductive layer 14, out of the conductive layer 14 and the interconnect 12. This is the difference between the insulating layer 20 in the semiconductor device 3 and the insulating layer 20 in the semiconductor devices 1, 2. Also, the insulating layer 40 accordingly covers the interconnect 12 directly.

Figure 6A:
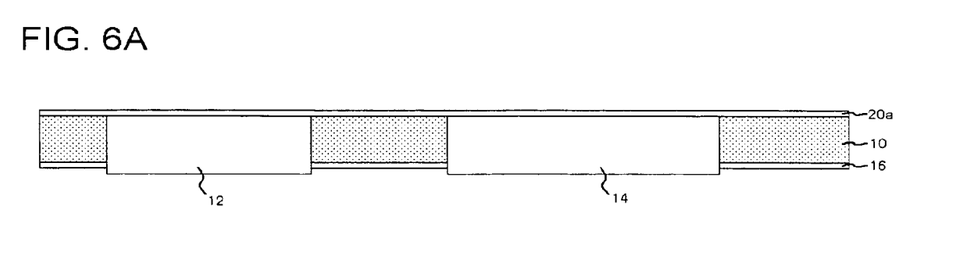
FIGS. 6A to 6C are schematic cross-sectional views progressively showing a method of manufacturing the semiconductor device shown in FIG. 5.

Referring to FIGS. 6A to 7B, a method of manufacturing the semiconductor device 3 will be described. Firstly the interconnect 12 and the conductive layer 14 are formed by the similar method to FIG. 2A. Then an insulating layer 20a, which is to serves as the insulating layer 20, is formed on the insulating interlayer 10 by CVD process for example (FIG. 6A).

Figure 6B:
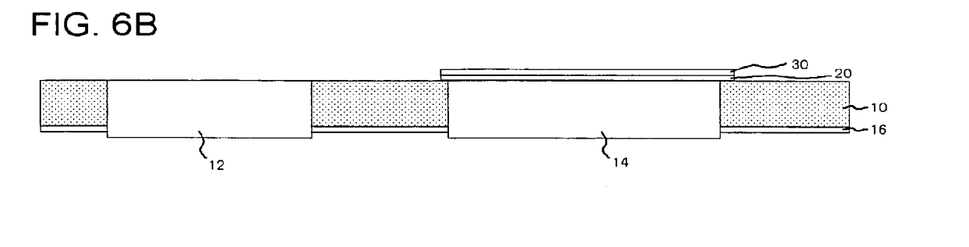
Figure 6C:
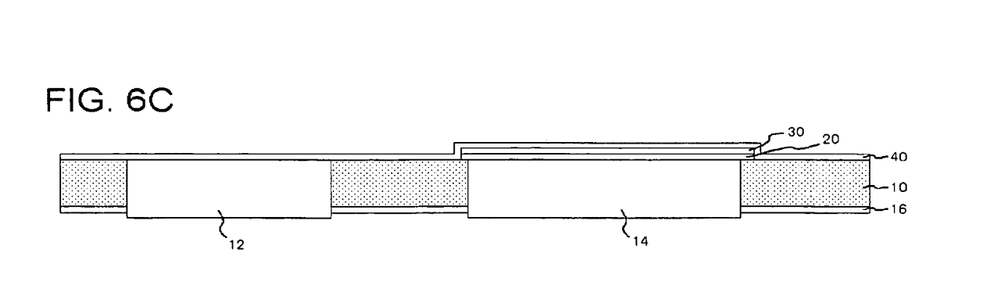

Next, on the insulating layer 20a, a conductive layer, which is to serve as the conductive layer 30, is formed by sputtering or CVD process for example. A predetermined portion of the conductive layer is then covered with a resist and subjected to an etching process. The etching process is also applied to the insulating layer 20a, with the conductive layer. As a result, the insulating layer 20 and the conductive layer 30 are obtained (FIG. 6B). Further, the insulating layer 40 is deposited, by CVD process for example, all over the insulating interlayer 10 including the region where the insulating layer 20 and the conductive layer 30 have been formed. At this stage, the insulating layer 40 that covers both the conductive layer 30 and the interconnect 12 is obtained (FIG. 6C).

Figure 7A:
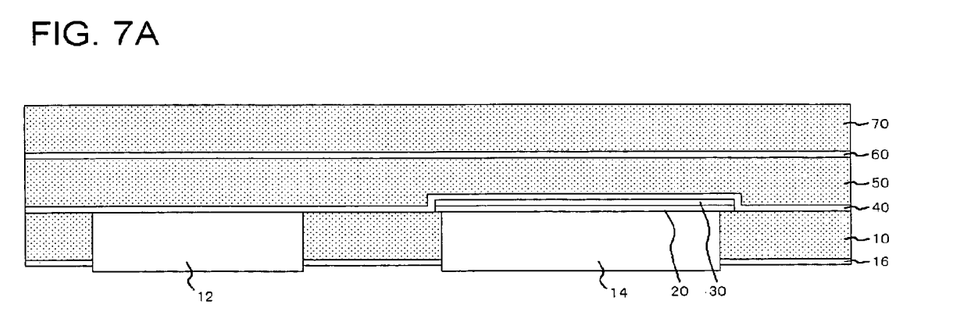
FIGS. 7A and 7B are schematic cross-sectional views progressively showing a method of manufacturing the semiconductor device shown in FIG. 5.
Figure 7B:
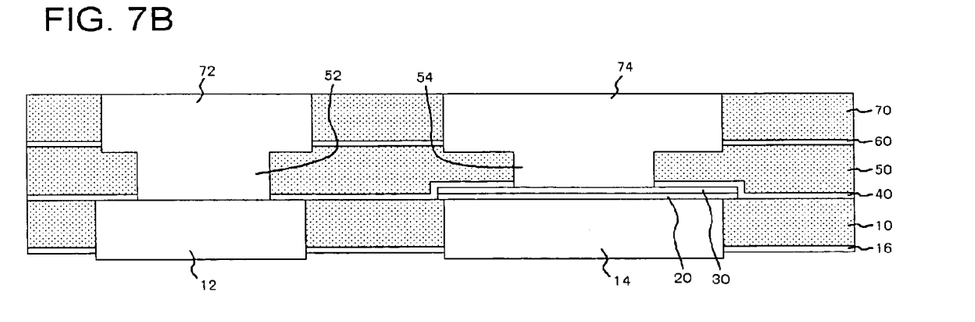

Next, on the insulating layer 40 thus formed, the insulating interlayer 50, the insulating layer 60 and the insulating interlayer 70 are sequentially formed (FIG. 7A). Then the via plugs 52, 54 and the interconnects 72, 74 are formed by the similar method to FIG. 3B (FIG. 7B).

This embodiment also provides the semiconductor device 3 that facilitates achieving a high and stable capacitance value, and the method of manufacturing such semiconductor device, for the same reasons as with the foregoing embodiments. Moreover, this embodiment allows further reducing the thickness of the insulating layer 20. Specifically, the insulating layer 20 can be made so thin that a portion of the insulating layer 20 uncovered with the resist is removed with the conductive layer, when the selective etching process on the conductive layer to form the conductive layer 30 is performed. This allows achieving a still higher capacitance value.

In the semiconductor device 3, the conductive layer 30 is larger in area than the conductive layer 14, and encloses therewithin the conductive layer 14 in a plan view, as in the semiconductor device 2. Such configuration, however, is not imperative but the conductive layer 30 may be made smaller in area than the conductive layer 14, so as to be enclosed therein in a plan view as in the semiconductor device 1.

Fourth Embodiment

Figure 8:
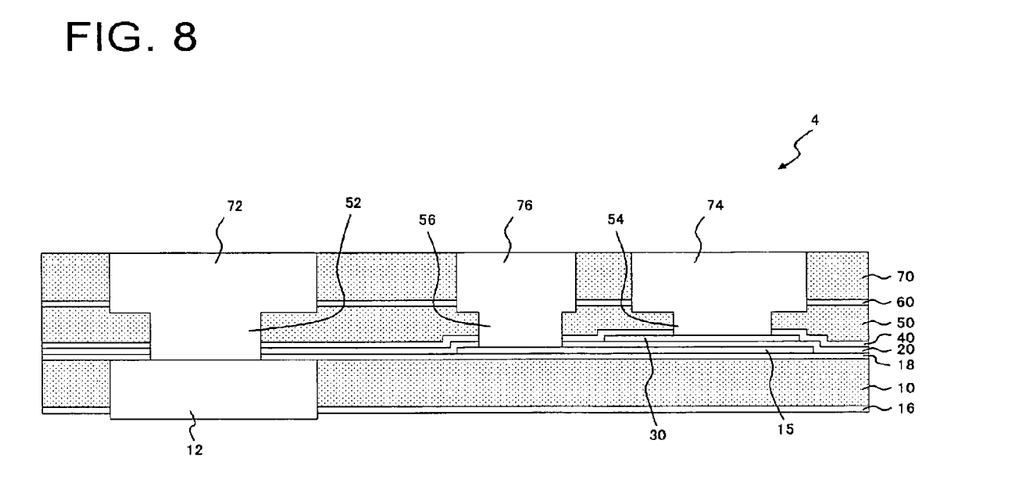
FIG. 8 is a schematic cross-sectional view showing a semiconductor device according to the fourth embodiment of the present invention.

FIG. 8 is a schematic cross-sectional view showing a semiconductor device according to the fourth embodiment of the present invention. The semiconductor device 4 includes the interconnect 12, a conductive layer 15 (first conductive layer), the insulating layer 20, the conductive layer 30, the insulating layer 40, the via plug 52 and the via plug 54.

The conductive layer 15 is provided on the insulating interlayer 10 via an insulating layer 18. Suitable materials of the conductive layer 15 include TiN, Ti, Ta, TiW, Al and W. Suitable materials of the insulating layer 18 include SiN, SiCN and SiON. In this embodiment, the conductive layer 15 serves as the lower electrode of the capacitor element, but not as an interconnect.

On the insulating layer 18, insulating layer 20 is provided so as to cover the conductive layer 15. On the insulating layer 20, the conductive layer 30 is provided. The conductive layer 30 is disposed so as to face a portion of the conductive layer 15 across the insulating layer 20. On the insulating layer 20, the insulating layer 40 is also provided. The insulating layer 40 covers both the conductive layer 30 and the interconnect 12. In this embodiment, the insulating layer 40 covers the interconnect 12 via the insulating layer 20 and the insulating layer 18.

On the insulating layer 40, the insulating interlayer 50 is provided. The insulating interlayer 50 includes a via plug 56 (third via plug) in addition to the via plugs 52, 54, all buried therein. The via plug 56 is formed so as to penetrate the insulating layer 40 and the insulating layer 20, thus to be connected to the conductive layer 15.

On the insulating interlayer 50, the insulating interlayer 70 is provided via the insulating layer 60. The insulating interlayer 70 includes, in addition to the interconnects 72, 74, an interconnect 76 connected to the via plug 56, buried therein. Here, the via plug 56 and the interconnect 76 are constituted of copper, and formed by Damascene process.

Figure 9A:
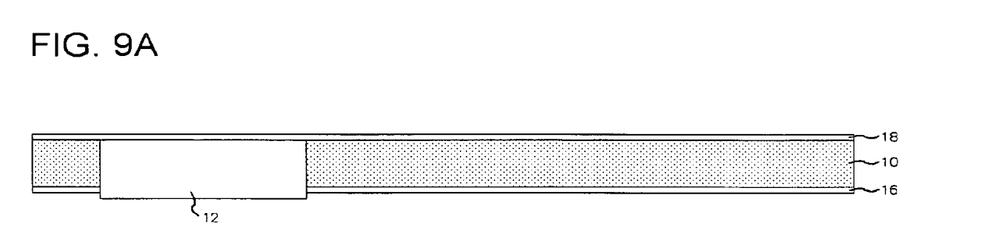
FIGS. 9A to 9C are schematic cross-sectional views progressively showing a method of manufacturing the semiconductor device shown in FIG. 8.

Referring to FIGS. 9A to 10C, a method of manufacturing the semiconductor device 4 will be described. First, after forming the insulating layer 16 and the insulating interlayer 10 in this sequence, the interconnect 12 is formed by Damascene process. Then the insulating layer 18 is deposited on the insulating interlayer 10, by CVD process for example (FIG. 9A).

Figure 9B:
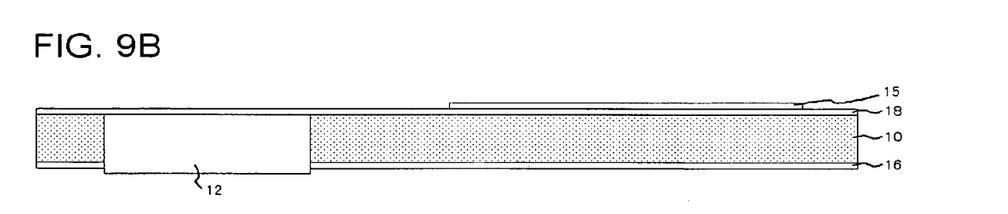
Figure 9C:
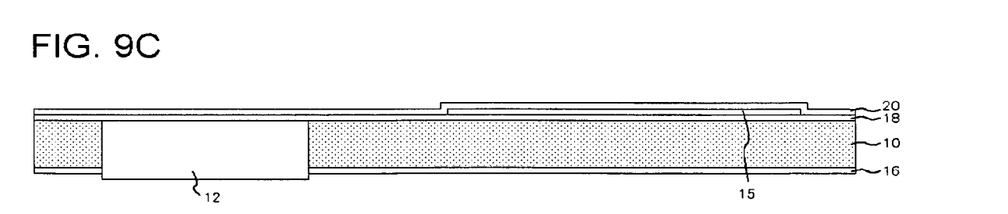

Next, on the insulating layer 18, a conductive layer, which is to serve as the conductive layer 15, is deposited by sputtering or CVD process for example. A predetermined portion of the conductive layer is then covered with a resist and subjected to an etching process, so as to form the conductive layer 15 (FIG. 9B). Further, the insulating layer 20 is deposited, by CVD process for example, all over the insulating layer 18 including the region where the conductive layer 15 has been formed (FIG. 9C).

Figure 10A:
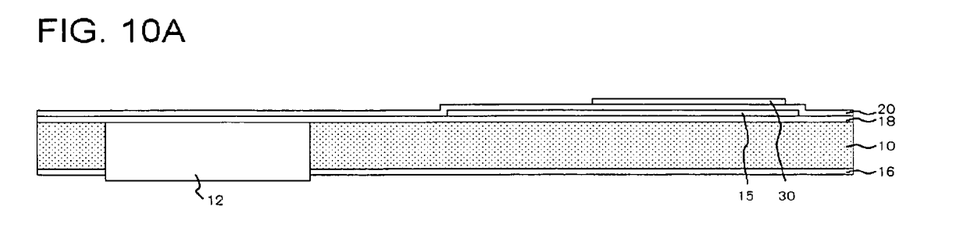
FIGS. 10A to 10C are schematic cross-sectional views progressively showing a method of manufacturing the semiconductor device shown in FIG. 8.
Figure 10B:
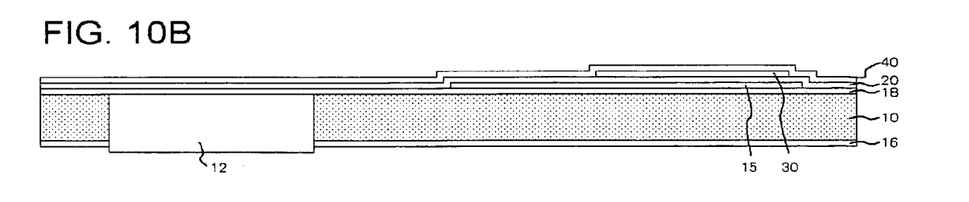

Thereafter, on the insulating layer 20, a conductive layer, which is to serve as the conductive layer 30, is formed by a sputtering or CVD process for example. A predetermined portion of the conductive layer is then covered with a resist and subjected to an etching process, so as to form the conductive layer 30 at a position facing a portion of the conductive layer 15 across the insulating layer 20 (FIG. 10A). Further, the insulating layer 40 is deposited, by CVD process for example, all over the insulating layer 20 including the region where the conductive layer 30 has been formed. At this stage, the insulating layer 40 that covers both the conductive layer 30 and the interconnect 12 is obtained (FIG. 10B).

Figure 10C:
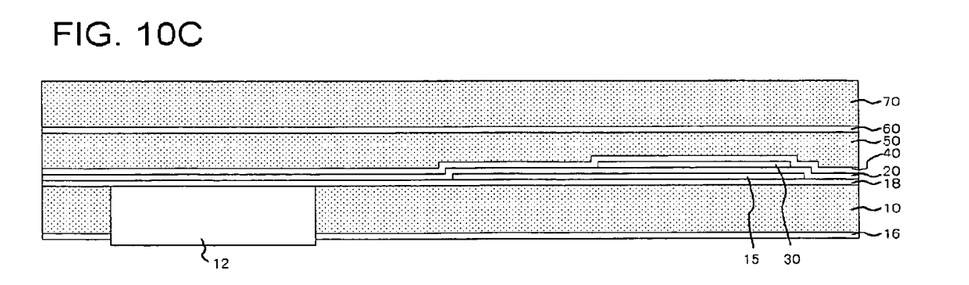

Next, on the insulating layer 40 thus formed, the insulating interlayer 50, the insulating layer 60 and the insulating interlayer 70 are sequentially formed (FIG. 10C). Then the via plugs 52, 54, 56 and the interconnects 72, 74, 76 are formed by Damascene process. In this process, the insulating layer 40 works as the etching stopper for the via plugs 52, 54, 56, and the insulating layer 60 works as the etching stopper for the interconnects 72, 74, 76. Thus, the semiconductor device 4 shown in FIG. 8 is obtained.

This embodiment also provides the semiconductor device 4 that facilitates achieving a high and stable capacitance value, and the method of manufacturing such semiconductor device, for the same reasons as with the foregoing embodiments. Moreover, it is the conductive layer 15 provided on the insulating interlayer 10 that serves as the lower electrode of the capacitor element, instead of the copper interconnect formed by Damascene process. Such configuration keeps the capacitor element free from adverse effects, even when the copper interconnect has an uneven surface.

The semiconductor device and the method of manufacturing the same according to the present invention are not limited to the foregoing embodiments, but various modifications may be made. To cite an example, in the foregoing embodiments the conductive layer 14 and the conductive layer 30 are different in size so that one is enclosed within the other in a plan view. However, the conductive layer 14 and the conductive layer 30 may be of the same size and overlap each other in a plan view. Here, the term "overlap in a plan view" means that orthographically projected images of the conductive layer 14 and the conductive layer 30 on a plane parallel to the substrate completely coincide with each other.

It is apparent that the present invention is not limited to the above embodiment, and may be modified and changed without departing from the scope and spirit of the invention.

What is claimed is:

1. A semiconductor device comprising:
an interconnect provided in a first insulating interlayer;
a first conductive layer located with a spacing from said interconnect;
a first insulating layer provided on said first conductive layer;
a second conductive layer provided so as to face said first conductive layer across said first insulating layer, said second conductive layer constituting a capacitor element in combination with said first conductive layer and said first insulating layer;
a second insulating layer covering both said second conductive layer and said interconnect, said second insulating layer also covering a part of said first insulating layer which does not cover said second conductive layer;
a first via plug provided in a second insulating interlayer, said second insulating interlayer having an etching selectivity different than that of said second insulating layer, said first via plug penetrating said second insulating layer thus to be connected to said interconnect; and
a second via plug provided in said second insulating interlayer, said second via plug penetrating said second insulating layer thus to be connected to said second conductive layer.

2. The semiconductor device according to claim 1, wherein said first conductive layer is provided in said first insulating interlayer, and serves as an interconnect.

3. The semiconductor device according to claim 1, wherein said second conductive layer is smaller in area than said first conductive layer, and enclosed within said first conductive layer in a plan view.

4. The semiconductor device according to claim 1, wherein said interconnect is a copper interconnect.

5. The semiconductor device according to claim 1, wherein said second via plug is made of a different conductive material than said second conductive layer.

6. The semiconductor device according to claim 5, wherein said second via plug is copper and said second conductive layer is selected from the group consisting of TiN, Ni, Ta, TiW, Al, and W.

7. The semiconductor device according to claim 1, wherein a material of said insulating layer is selected from the group consisting of SiN, SiCN, and SiON.

* * * * *